United States Patent [19]

Beane et al.

[11] Patent Number: 5,099,550

[45] Date of Patent: Mar. 31, 1992

[54] CLAMP FOR ATTACHMENT OF A HEAT SINK

[75] Inventors: Glenn Beane, Plymouth; Allen Hillman, Laconia, both of N.H.

[73] Assignee: MI Proprietary, Concord, N.H.

[21] Appl. No.: 609,265

[22] Filed: Nov. 5, 1990

[51] Int. Cl.[5] .................. A44B 21/00; H05K 7/00
[52] U.S. Cl. ........................... 24/555; 24/458; 248/228; 361/388
[58] Field of Search .............. 24/555, 522, 458; 403/387; 248/72, 228; 361/381, 383, 388, 386, 395; 357/81

[56] References Cited

U.S. PATENT DOCUMENTS

| | | | |
|---|---|---|---|
| 1,326,802 | 12/1919 | Strathern | 248/72 |
| 1,443,709 | 1/1923 | Goldstein | 24/10 R |
| 2,354,746 | 8/1944 | Duzmal | 248/228 |
| 2,877,974 | 3/1959 | Estes | 248/228 |
| 4,563,725 | 1/1986 | Kirby | 361/388 |
| 4,652,973 | 3/1987 | Baker et al. | 361/395 |
| 4,710,852 | 12/1987 | Keen | 24/458 |
| 4,899,255 | 2/1990 | Case et al. | 361/386 |
| 4,978,638 | 12/1990 | Buller et al. | 437/209 |

FOREIGN PATENT DOCUMENTS 543422 4/1958 Italy .................. 403/387

*Primary Examiner*—Victor N. Sakran
*Attorney, Agent, or Firm*—Fish & Richardson

[57] ABSTRACT

A resilient clamp for attaching the heat sink to a semiconductor package comprising a first end having a rounded knob and a second end for connecting with a semiconductor package, the clamp having a smaller radius of curvature at one end so as to allow the clamp to be flexed so it may be attached.

20 Claims, 2 Drawing Sheets ism 5,099,550

CLAMP FOR ATTACHMENT OF A HEAT SINK

BACKGROUND OF THE INVENTION

This invention relates to heat sinks and particularly to the means for attaching them to semiconductor devices.

Heat sinks commonly are attached to electronic devices (e.g., integrated circuits) to dissipate the heat which the devices generate during operation. In order to do this, the heat sinks are designed to have a maximum surface area, the size of which determines their heat dissipating capacity, while still occupying the smallest possible volume so that the heat sink takes up as little usable space as possible in the electronic assembly.

Most heat sinks have flat surfaces called fins to dissipate the heat, and one type of heat sink, called a "pin-fin" heat sink, comprises a matrix of separate pins that extend from a backing plate. In each case, the metal fins or pins serve as the heat-dissipating means for the heat sink. In many cases, the side of the backing plate opposite the fins or pins is adapted to be mounted or otherwise secured to the electronic device to be cooled. During operation, the heat sink may be further cooled by blowing air vertically or horizontally over and between the fins or pins. As most of these finished heat sinks are then secured to a semiconductor package by an adhesive applied to the backing plate opposite the pins, the heat sinks are difficult to remove, which removal is desirable whenever the semiconductor needs to be replaced.

SUMMARY OF THE INVENTION

The invention features resilient "C" shaped clamp which fits to removably secure the heat sink to a semiconductor. Specifically, the invention features a resilient clamp which is generally "C" shaped with a first end having an inwardly projecting arcuate knob that fits into a groove on a heat sink and a second end having a substantially flat region that includes a notch for engaging a semiconductor. The radius of curvature of the clamp in the region of the knob is smaller than that near the flat region. The resilient clamp is easily installed by fitting the notch against the semiconductor and then locating the knob in the groove on the heat sink. Removal of the heat sink from the semiconductor is equally easy and accomplished by flexing the clamp so that the notch disengages the groove. The heat sink-semiconductor assembly is compact, and thus several heat sink-heat generating device assemblies may be disposed on a printed circuit board in a relatively small space.

Other features and advantages of the invention will be apparent from the following description of the preferred embodiment and from the claims.

DESCRIPTION OF THE PREFERRED EMBODIMENT

We first briefly describe the drawings.

Figure 1:
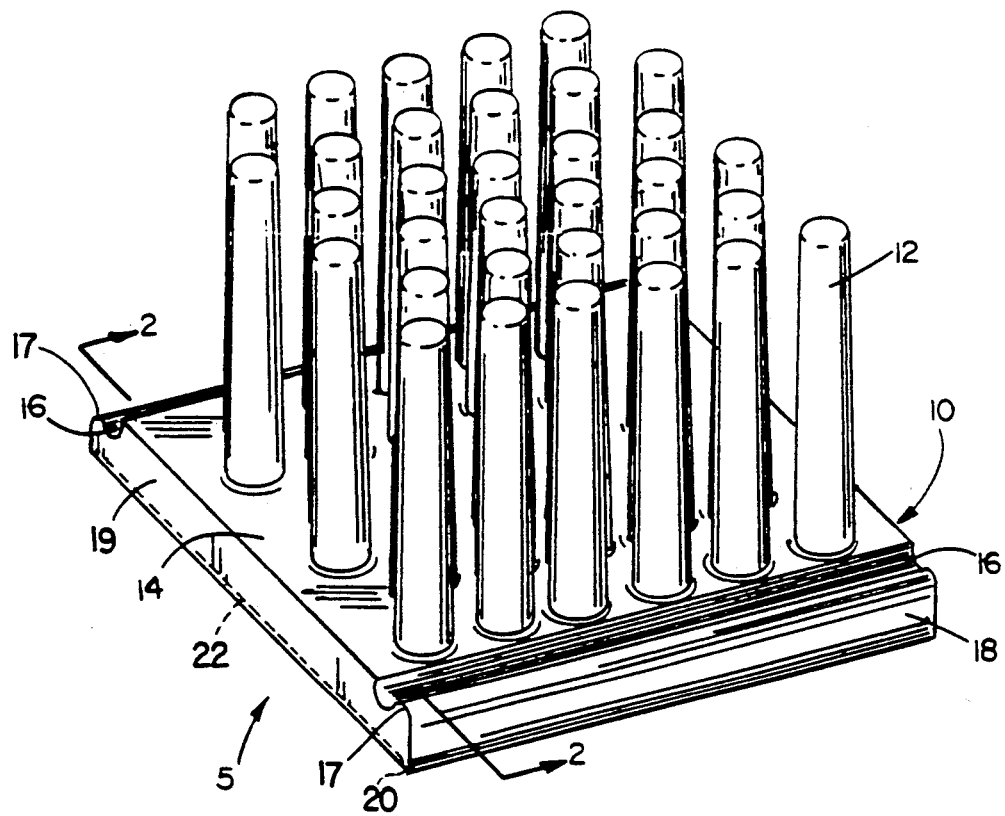
Figure 2:
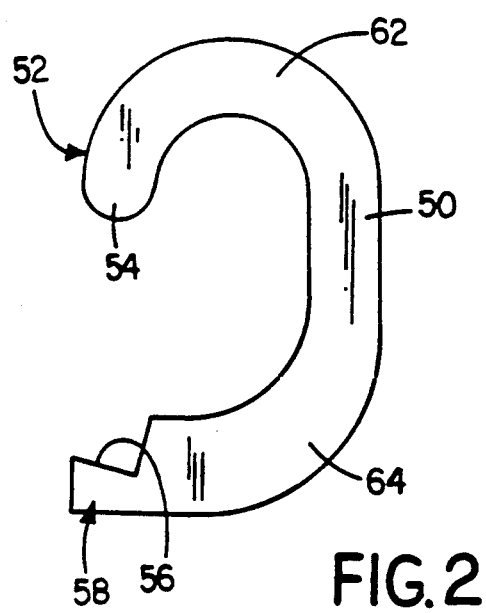
Figure 3:
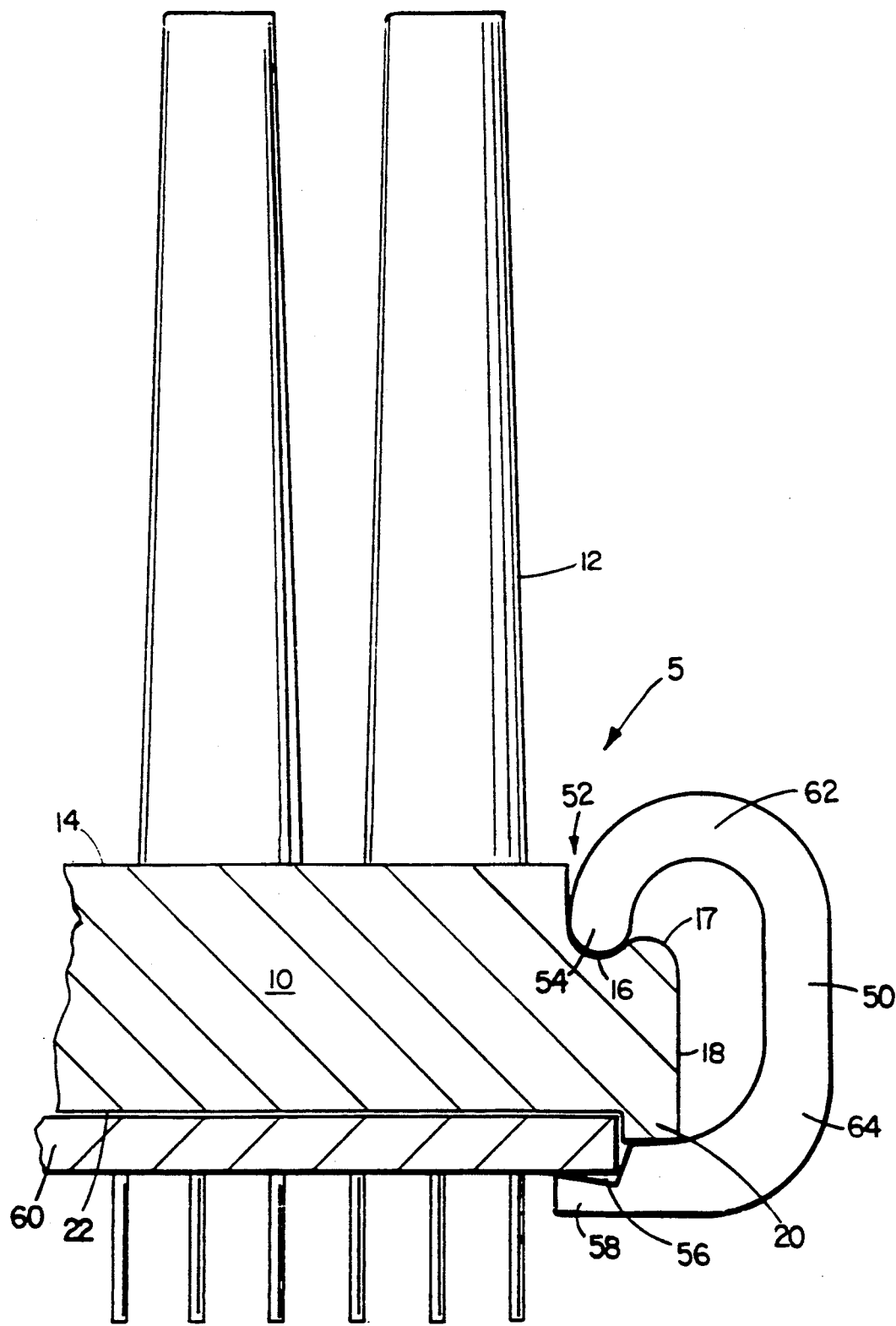

FIG. 1 is a perspective view of a pin-fin heat sink.
FIG. 2 is a view of the clamp of this invention.
FIG. 3 is a side sectional view of a portion, of the heat sink of FIG. 1 and a clamp of this invention to hold it in place on a semiconductor.

STRUCTURE AND OPERATION

Referring to FIGS. 1 and 2, a pin-fin heat sink 5 molded from thermally conductive material includes a backing plate 10. The backing plate has a front face 14, a back face 22, and two pairs of parallel side walls 18, 19. Each edge of the front face 14 adjacent to the two parallel side walls 18 terminates at an inner edge of a rounded groove 16. The outer edge of each groove 16 is rounded to form a shoulder 17. Around the perimeter of the back face 22 is a lip 20. The lip 20 and the back face 22 form a cavity 23 having dimensions selected to approximately match those of the semiconductor with which the heat sink 5 is to be used. Projecting from the front face 14 is a collection of pins 12. In operation, the pins 12 serve to dissipate heat from the semiconductor. This pin-fin type of heat sink is shown for illustrative purposes only, as other types of heat sinks may be made or used by or with the invention herein.

In use, the heat sink 5 is attached to a semiconductor 60, as shown in FIG. 3, and serves to dissipate the heat produced by the device. To insure maximum benefit from the high heat conductivity of the pin-fin heat sink 5, the heat sink should fit snugly against the semiconductor. Referring to FIG. 3, the cavity 23 in heat sink 5 allows the semiconductor 60 to fit snugly against the back face 22. The lip 20 assists in preventing relative lateral movement of heat sink 5 with respect to the semiconductor 60. Heat sink 5 is fastened in place by one or more resilient "C" clamps 50, as shown in FIG. 2. "C" clamp 50 is manufactured of high performance engineering thermoplastic (MII "THERMOPLAST") available from Materials Innovations, Inc. of New Hampshire and it is of generally arcuate construction. An upper portion 62 of clamp 50 has a smaller radius of curvature than a lower portion 64 of the clamp. At the end 52 of clamp 50, adjacent to portion 62, is an inwardly directed knob 54. At the other end 58, adjacent to portion 64, is a flat portion terminating in a notch 56.

For attachment, the notch 56 is fitted over the edge of the semiconductor 60. "C" clamp 50 is then stretched open, flexing primarily at the upper portion 62, and eased over the rounded shoulder 17 of the heat sink 5. The knob 54 is then allowed to spring in place in groove 16 on the front face 14 of heat sink 5. Because the radius of curvature of the end of knob 54 is the same size as, or slightly smaller than, the radius of curvature of the bottom of groove 16, the knob and groove fit together as would a ball and socket. The inwardly projecting aspect of knob 54 and the smaller radius of curvature of portion 62 of the "C" clamp 50 insure a tight fit and force the heat sink 5 against semiconductor 60. Clamp 50 is easily removable for disassembly of the heat sink from the heat generating device by reflexing it so that the knob 54 leaves the groove 16. A similar clamp (not shown) is attached to the identical groove on the opposite side of the heat sink 5.

Other embodiments are within the following claims. For example, the "C" clamp 50 may also be wide, so that one clamp extends the entire side of the heat sink, or narrow, so that several are used on each side. Instead of groove 16, a row of rounded depressions may be used to receive the clamps on the heat sink.

What we claim is:

1. A clamp for selectively attaching a heat sink to a device of the kind adapted to be mounted on a substrate, said clamp comprising
a resilient curved portion with a first end having a rounded knob adapted to be received by a receiving means in the heat sink and a second end having attachment means for engaging the device, said resilient curved portion being constructed to apply compression between said first end and said second end when said curved portion is flexed, said clamp holding the heat sink to the device by engaging said attachment means with said device and flexing said curved portion so that said knob is received by the receiving means in the heat sink, whereby said clamp compresses the heat sink between said first end of said curved portion and the device.

2. The clamp of claim 1 wherein said clamp is generally "C" shaped.

3. The clamp of claim 1 wherein said curved portion has a first portion near said knob and a second portion near said attachment means.

4. The clamp of claim 3 wherein said curved portion has a smaller radius of curvature proximate to said knob than proximate to said attachment means.

5. The clamp of claim 1 wherein said attachment means comprises a notch.

6. The clamp of claim 1 wherein said device includes a semiconductor package.

7. The clamp of claim 6 wherein said heat sink is mounted directly on said semiconductor package.

8. The clamp of claim 7 wherein said semiconductor package includes a first surface that faces said substrate, said attachment means being adapted to engage at least a portion of said first surface so that said clamp compresses said heat sink against a second, opposite surface of said semiconductor package.

9. The clamp of claim 1 wherein said device includes a member that includes at least one electrical conductor adapted to be connected to an electrical conductor on said substrate when said device is mounted on said substrate.

10. The clamp of claim 9 wherein said device includes a semiconductor package, said heat sink being disposed on said package.

11. The clamp of claim 1 adapted for use with a heat sink having an elongated dimension, at least said first end of said curved portion being elongated to engage said heat sink substantially along said elongated dimension.

12. The clamp of claim 1 wherein said clamp comprises electrically insulating material.

13. The clamp of claim 1 wherein said substrate comprises a printed circuit board.

14. Apparatus assembly for dissipating heat from a device that is mounted on a substrate, said apparatus comprising a heat sink adapted to be disposed on said device, and
a clamp for selectively attaching said heat sink to said device, said clamp including a resilient curved portion with a first end having a rounded knob adapted to be received by a receiving means in said heat sink and a second end having attachment means for engaging said device, said resilient curved portion being constructed to apply compression between said first end and said second end when said curved portion is flexed, said clamp holding the heat sink to the device by engaging said attachment means with said device and flexing said curved portion so that said knob is received by the receiving means in the heat sink, whereby said clamp compresses said heat sink between said first end of said curved portion and said device.

15. The apparatus of claim 14 wherein a plurality of said devices are disposed on said substrate with a plurality of said heat sinks, at least one of said heat sinks being adapted to be disposed on only a single one of said devices so that said heat sink can be selectively attached to and removed from said one device using said clamp without disturbing attachment of other ones of said heat sinks to other ones of said devices.

16. The apparatus of claim 14 wherein said device includes a semiconductor package.

17. The apparatus of claim 16 wherein said heat sink is mounted directly on said semiconductor package.

18. The apparatus of claim 17 wherein said semiconductor package includes a first surface that faces said substrate, said attachment means being adapted to engage at least a portion of said first surface so that said clamp compresses said heat sink against a second, opposite surface of said semiconductor package.

19. The apparatus of claim 14 wherein said device includes a member that includes at least one electrical conductor adapted to be connected to an electrical conductor on said substrate when said device is mounted on said substrate.

20. The apparatus of claim 19 wherein said device includes a semiconductor package, said heat sink being disposed on said package.

* * * * *